(12) United States Patent
Nawata (10) Patent No.: US 9,599,185 B2
(45) Date of Patent: Mar. 21, 2017

(54) VIBRATION CONTROL APPARATUS, LITHOGRAPHY APPARATUS, AND ARTICLE MANUFACTURING METHOD

(71) Applicant: CANON KABUSHIKI KAISHA, Tokyo (JP)

(72) Inventor: Ryo Nawata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/745,790

(22) Filed: Jun. 22, 2015

(65) Prior Publication Data

US 2015/0369330 A1 Dec. 24, 2015

(30) Foreign Application Priority Data

Jun. 23, 2014 (JP) .................................. 2014-127814

(51) Int. Cl.
*G03B 27/42* (2006.01)
*F16F 15/02* (2006.01)
*G03F 7/20* (2006.01)

(52) U.S. Cl.
CPC ............ *F16F 15/022* (2013.01); *G03F 7/709* (2013.01); *G03F 7/70833* (2013.01); *F16F 2230/0023* (2013.01)

(58) Field of Classification Search
CPC ............. G03F 7/70833; G03F 7/70775; G03F 7/70766

USPC ........................ 355/53, 72–76; 248/618, 638
See application file for complete search history.

(56) References Cited

U.S. PATENT DOCUMENTS 9,052,614 B2 * 6/2015 Nawata .................. G03F 7/709
2004/0164253 A1 * 8/2004 Ito .......................... F16F 7/1011
   250/491.1
2012/0105820 A1 5/2012 Nawata et al.

FOREIGN PATENT DOCUMENTS

JP 2009168122 A 7/2009
JP 2012097786 A 5/2012

\* cited by examiner

*Primary Examiner* — Hung Henry Nguyen
(74) *Attorney, Agent, or Firm* — Rossi, Kimms & McDowell LLP (57) ABSTRACT

A vibration control apparatus is provided that controls the vibration of a first object supported by a base, the apparatus including: a first control system including a first compensator for outputting a first operation signal representing an input to a first driving unit based on a first detection signal output by a first detector; a second control system including a second compensator for outputting a second operation signal representing an input to a second driving unit based on a second detection signal output by a second detector; and a third control system including a third compensator for outputting a third operation signal representing an input to the first driving unit based on a signal relating to the second control system so as to compensate the vibration of the base.

10 Claims, 12 Drawing Sheets

VIBRATION CONTROL APPARATUS, LITHOGRAPHY APPARATUS, AND ARTICLE MANUFACTURING METHOD

BACKGROUND OF THE INVENTION

Field of the Invention

The present invention relates to a vibration control apparatus, a lithography apparatus, and an article manufacturing method.

Description of the Related Art

In a lithography apparatus configured to transfer or form ultra-fine patterns, the vibration transmitted from a floor on which the apparatus is mounted to the apparatus may cause degradation of overlay accuracy or resolution (transfer) performance. Hence, in the conventional lithography apparatus, its surface plate, which is the main body thereof, is supported via a vibration control apparatus (vibration isolation apparatus) so as to reduce influence of the floor vibration. The conventional vibration control apparatus includes a gas spring for supporting the surface plate, and further includes a velocity feedback control system that is composed of an acceleration sensor for detecting acceleration of the surface plate and an actuator for applying a force to the surface plate so as to damp the vibration. However, in the case in which the vibration is damped by the feedback control system, the natural frequency of the vibration control apparatus, which depends on the natural frequency of the gas spring, is 3 to 5 Hz at the lowest. Thus, in order to isolate the vibration in a lower frequency, the natural frequency of the vibration control apparatus needs to be reduced.

Japanese Patent Laid-Open No. 2012-97786 discloses a vibration control apparatus including a two-degrees-of-freedom vibration system composed of a reference object and a supporting unit having a mass body for supporting the object. In this vibration control apparatus, a control force is applied to the mass body so that relative displacement between the reference object and the mass body is constant in order to isolate the vibration of the reference object in a lower frequency, and further, a controlled object is positioned at the reference object so as to isolate the vibration of the controlled object in a lower frequency within the servo bandwidth for position control.

Japanese Patent Laid-Open No. 2009-168122 discloses a vibration isolation apparatus including a one-degree-of-freedom vibration system composed of a reference object and a supporting unit for supporting the object. In this vibration isolation apparatus, the reference object is supported by the supporting unit with a low natural frequency so as to isolate the vibration in a lower frequency, and the controlled object is positioned at the reference object so as to isolate the vibration of the object in a lower frequency within the servo bandwidth for position control. In addition, this vibration isolation apparatus further includes a displacement sensor installed therein for detecting displacement of a base structure, and a driving unit located between the controlled object and the base structure applies a control force to the controlled object based on the detected displacement in order to cancel a disturbance force applied to the controlled object due to the displacement of the base structure. Such feedforward control can suppress a disturbance force from being applied to the controlled object due to the displacement of the base structure.

However, in the vibration control apparatus disclosed in Japanese Patent Laid-Open No. 2012-97786, since the controlled object cannot track the reference object in a frequency bandwidth exceeding the servo bandwidth, the vibration isolation performance cannot be improved. In contrast, in the vibration isolation apparatus disclosed in Japanese Patent Laid-Open No. 2009-168122, since a displacement sensor further needs to be installed for detecting displacement of the base structure, the cost will be increased. In addition, when a detecting point of the displacement sensor for measuring a position of the reference object relative to the controlled object for positioning the controlled object at the reference object is different from a detecting point of the displacement sensor for detecting displacement of the base structure, the vibration of the controlled object due to the displacement of the base structure cannot be accurately detected.

SUMMARY OF THE INVENTION

The present invention provides a vibration control apparatus that is advantageous for expanding a frequency bandwidth of a vibration capable of being isolated by, for example, a simple configuration.

According to an aspect of the present invention, a vibration control apparatus that controls the vibration of a first object supported by a base is provided, the apparatus comprising: a first elastic mechanism installed on the base for displaceably supporting the first object; a first driving unit for displacing the first object; a second object; a second elastic mechanism for displaceably supporting the second object; a third object for supporting the second elastic mechanism; a third elastic mechanism installed on the base for displaceably supporting the third object; a second driving unit for displacing the third object; a first detector for detecting a relative position between the first object and the second object; a second detector for detecting a relative position between the second object and the third object; a first control system including a first compensator for outputting an first operation signal representing an input to the first driving unit based on a first detection signal output by the first detector; a second control system including a second compensator for outputting a second operation signal representing an input to the second driving unit based on a second detection signal output by the second detector; and a third control system including a third compensator for outputting a third operation signal representing an input to the first driving unit based on a signal relating to the second control system so as to compensate vibration of the base.

Further features of the present invention will become apparent from the following description of exemplary embodiments with reference to the attached drawings.

DESCRIPTION OF THE EMBODIMENTS

Hereinafter, preferred embodiments of the present invention will be described with reference to the attached drawings.

First Embodiment

Figure 1:
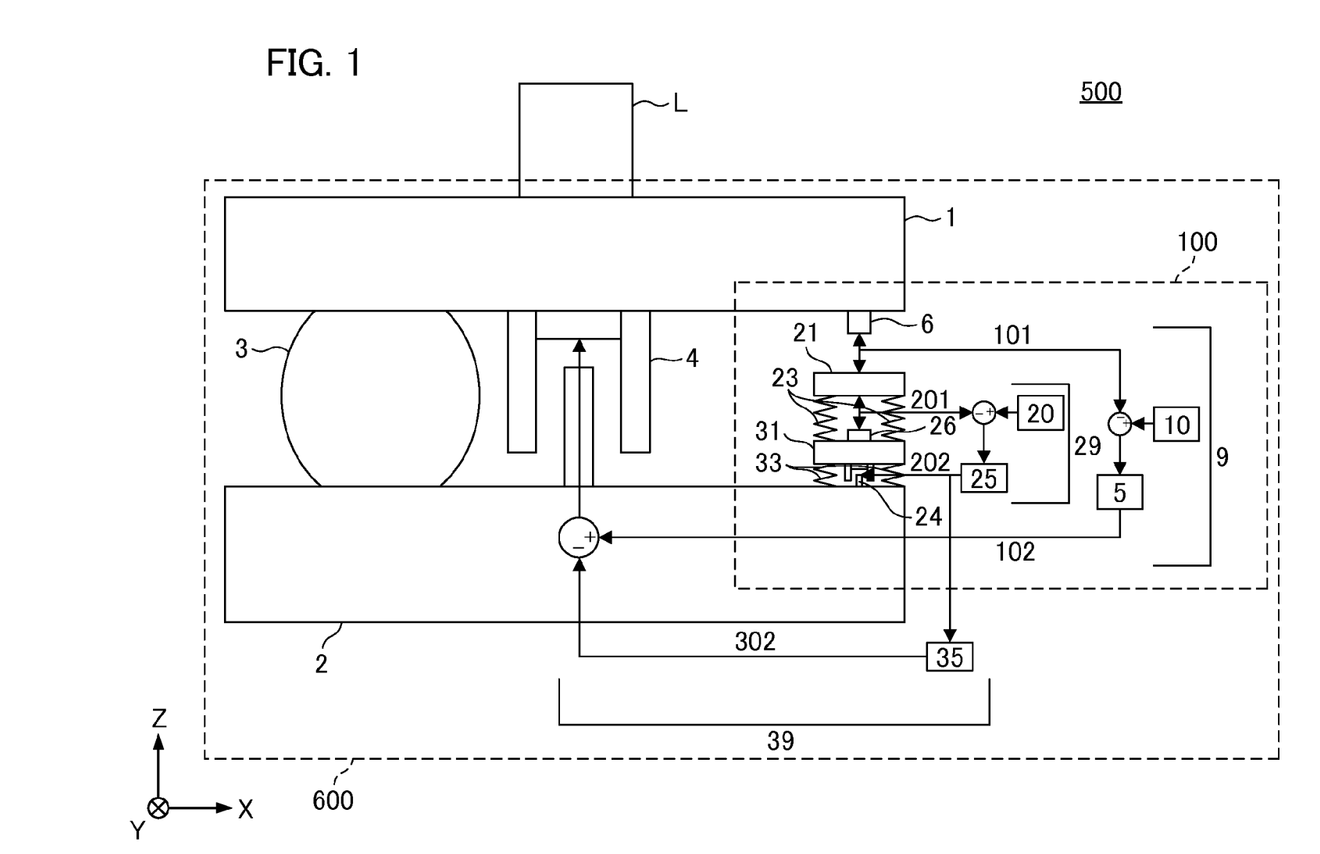
FIG. 1 is a diagram illustrating a configuration of a vibration control apparatus according to a first embodiment of the present invention.

Firstly, a vibration control apparatus according to a first embodiment of the present invention will be described. The vibration control apparatus according to this embodiment controls the vibration of an object that may be transmitted from another object. It is contemplated herein that the vibration control apparatus is installed in a lithography apparatus employed in a lithography process during manufacturing a semiconductor device, a liquid crystal display, or the like. FIG. 1 is a schematic diagram illustrating a configuration of a lithography apparatus 500 including a vibration control apparatus 600 according to this embodiment. In the figure, the X axis and the Y axis are orthogonal to each other in a plane perpendicular to the Z axis in a vertical direction. The lithography apparatus 500 includes a processor L for performing a pattern formation on a substrate that is a processed body, and the vibration control apparatus 600 for controlling vibration of a first object 1 as at least a component constituting the processor L.

The processor L is the main body or a part of a unit for forming a pattern on a substrate, and the first object 1 is a supporting unit (e.g., surface plate) for supporting (mounting) the unit. In the case where the lithography apparatus 500 is an imprint apparatus that molds an uncured layer on a substrate with a mold, releases the mold, and forms a pattern on the substrate, the unit may include a holding unit (e.g., a substrate holder or a mold holder) for holding at least one of the substrate and the mold. In the case where the apparatus is a drawing apparatus that projects a charged particle beam onto a layer on a substrate sensitive to the charged particle beam for a drawing operation, the unit may include a holding unit (e.g., a projection system housing or a substrate holder) for holding at least one of the projection system for projecting a charged particle beam, and the substrate. Furthermore, in the case where the apparatus is an exposure apparatus that projects a light onto a layer on a substrate sensitive to a light to expose the layer, the unit may include a holding unit (e.g., a lens barrel, an original plate holder, or a substrate holder) for holding at least one of the projection system for projecting light, the original plate, and the substrate. In addition, the processor L is supported by the first object 1, which is supported via a first spring mechanism 3 and the first driving unit 4, while the base 2 supports the entirety of the lithography apparatus 500.

The vibration control apparatus 600 is installed between the base 2 as a vibration source and the first object 1 as a vibration controlled object (vibration isolated object), and includes a first spring mechanism 3, a first driving unit 4, and a reference unit 100. The first spring mechanism (first elastic mechanism) 3 includes, for example, a gas spring (air spring) as an elastic member. The first driving unit 4, which includes a linear motor for example, applies a force to the first object 1 to displace it relative to the base 2.

The reference unit 100 includes a second object 21, a second spring mechanism (second elastic mechanism) 23, a third object 31, a third spring mechanism (third elastic mechanism) 33, a second driving unit 24, a second detector 26, a second compensator 25, a first detector 6, and a first compensator 5. The second object 21 is displaceably supported by the third object 31 via the second spring mechanism 23. The third object 31 is displaceably supported by the base 2 via the third spring mechanism 33. The second driving unit 24 applies a force to the third object 31 to displace it relative to the base 2. The second detector 26 outputs the relative displacement between the second object 21 and the third object 31 (a relative position; a position or displacement of one of the second object 21 and the third object 31 relative to the other) as a second detection signal 201. The first detector 6 outputs relative displacement between the first object 1 and the second object 21 (a relative position; a position or displacement of one of the first object 1 and the second object 21 relative to the other) as a first detection signal 101. In this regard, both of a detected point of the first detector 6 and a detected point of the second detector 26 are desirably in a straight line extending in a vertical direction (Z axis direction) as shown in FIG. 1. This allows the first detector 6 and the second detector 26 to accurately detect each displacement.

Firstly, the third object 31 is position-feedback-controlled by a second feedback control system 29 as a second control system based on the second detection signal 201 so that relative displacement between the second object 21 and the third object 31 is constant. The second compensator 25, which is included in the second feedback control system 29, calculates (generates) and outputs a second input (second operation signal) 202 to the second driving unit 24 based on the second detection signal 201 and a target value 20 in order to apply a damping force to the third object 31. A PID compensator may be employed as the second compensator 25. Where Kp2 is a proportional gain, Ki2 is an integral gain, Kd2 is a derivative gain, and s ($s=\sigma+i\omega$) is a complex frequency used in Laplace transform, the second compensator 25 is expressed by the formula (1).

[Formula 1]

$$\text{Second Compensator 25} = Kp2 + \frac{Ki2}{s} + Kd2 \cdot s \quad (1)$$

In contrast, the first object 1 is position-feedback-controlled by a first feedback control system 9 as a first control system based on the first detection signal 101. The first compensator 5, which is included in the first feedback control system 9, calculates (generates) and outputs a first input (first operation signal) 102 to the first driving unit 4 based on the first detection signal 101 and a target value 10. Note that it is contemplated herein that the servo bandwidth of the first feedback control system 9 is 30 Hz.

Figure 2:
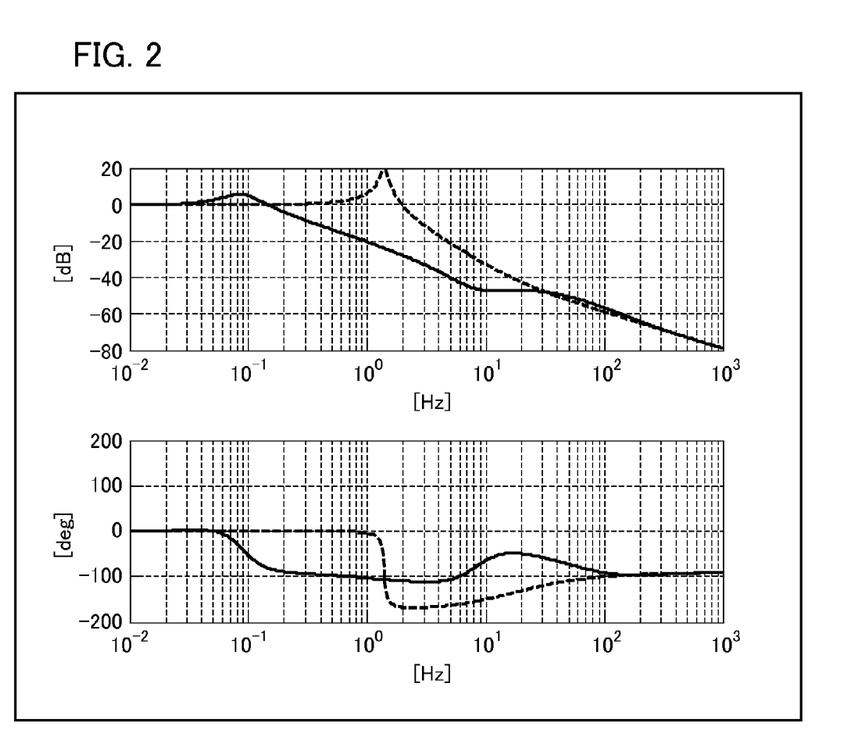
FIG. 2 is a Bode plot of the vibration transmissibility from a base to a first object as a comparative example.

FIG. 2 is a Bode plot (the upper graph for gain and the lower graph for phase) illustrating the vibration transmissibility from the base 2 to the first object 1 as a comparative example. In the figure, the dashed lines indicate the case where the first feedback control system 9 is off and the solid lines indicate the case where the first feedback control system 9 is on. It can be seen from FIG. 2 that the vibration ranging from about 0.1 Hz to 30 Hz transmitted from the base 2 to the first object 1 is greatly reduced by turning on the first feedback control system 9.

Figure 3:
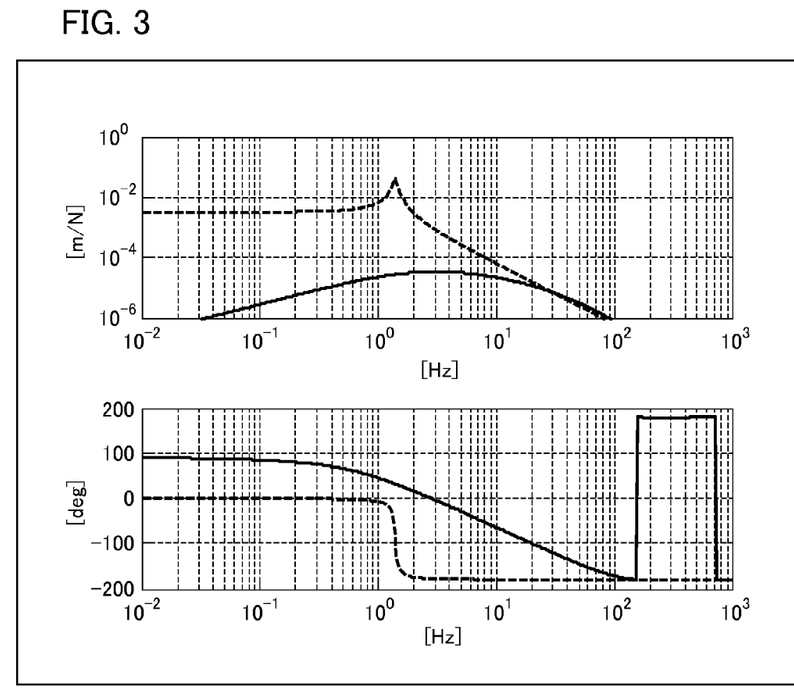
FIG. 3 is a Bode plot of compliance of a first object as a comparative example.

FIG. 3 is a Bode plot (the upper graph for compliance and the lower graph for the phase) illustrating compliance (displacement/force, i.e., reciprocal of rigidity) of the first object 1. In the figure, the dashed lines indicate the case where the first feedback control system 9 is off and the solid lines indicate the case where the first feedback control system 9 is on. It can be seen from FIG. 3 that a vibration of about 30 Hz or less that may be generated on the first object 1 can be greatly reduced by turning on the first feedback control system 9.

Thus, both of the vibration isolation performance (isolation of vibration transmitted from the base 2) and the vibration damping performance (damping of the vibration caused by a disturbance force applied to the first object 1) of the first object 1 can be improved by using the first feedback control system 9. However, since the first object 1 is position-feedback-controlled to the second object 21 by the first feedback control system 9, the vibration isolation performance is not improved in a frequency bandwidth exceeding the servo bandwidth of the first feedback control system 9 as shown in FIG. 2. For this, one approach to improving the vibration isolation performance in a frequency bandwidth exceeding the servo bandwidth may include feedforward control by detecting the vibration of the base 2 and applying a control force to the first object 1 so as to compensate the vibration. However, the addition of an acceleration sensor, a velocity sensor, a displacement sensor, or the like for detecting the vibration of the base 2 may increase the device cost. In addition, the implementation of a sensor newly added for detecting the vibration of the base 2 is difficult in light of the positional interference with the first spring mechanism, the first driving unit 4, or the like. Moreover, as to its implementation, when a detecting point of the first detector 6 is different from a detecting point of a sensor for detecting the vibration of the base 2, the vibration applied to the first object 1 due to the vibration of the base 2 cannot accurately detected, and this makes it impossible to perform effective feedforward control. Then, in this embodiment, the vibration control apparatus 600 will improve the vibration isolation performance in a frequency bandwidth exceeding the servo bandwidth of the first feedback control system 9 by adding a feedforward control system as a third control system described below.

Figure 4:
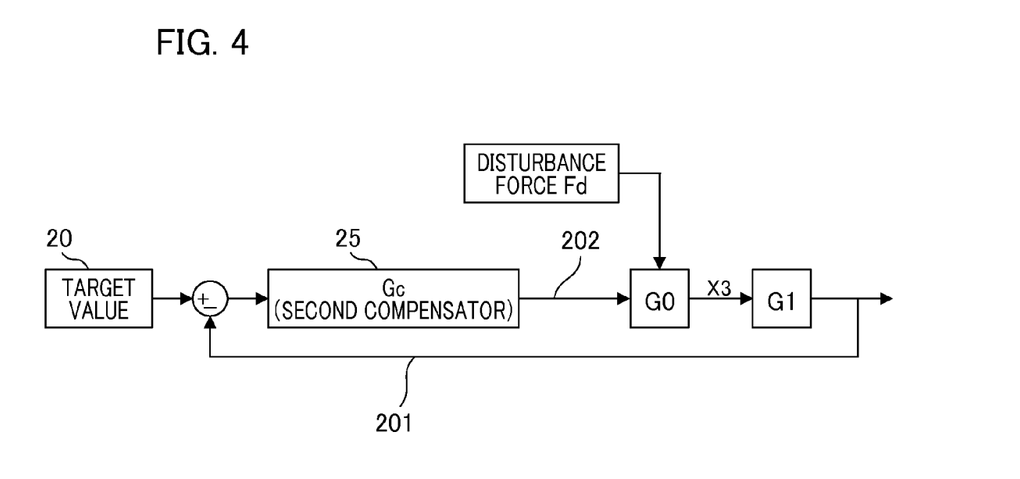
FIG. 4 is a block diagram of a second feedback control system.

FIG. 4 is a block diagram illustrating the second feedback control system 29. In the figure, Gc indicates the second compensator 25, G0 indicates a transfer function from a force applied to the third object 31 to absolute displacement X3 of the third object 31, and G1 indicates a transfer function from the absolute displacement X3 of the third object 31 to a first detection signal 201. In this case, a transfer function from a disturbance force Fd, which is applied to the third object 31, to a second input 202 is expressed by the formula (2).

[Formula 2]

$$\text{Second input } 202 = -1 \cdot \frac{Gc \cdot G0 \cdot G1}{1 + Gc \cdot G0 \cdot G1} \cdot Fd \qquad (2)$$

Figure 5:
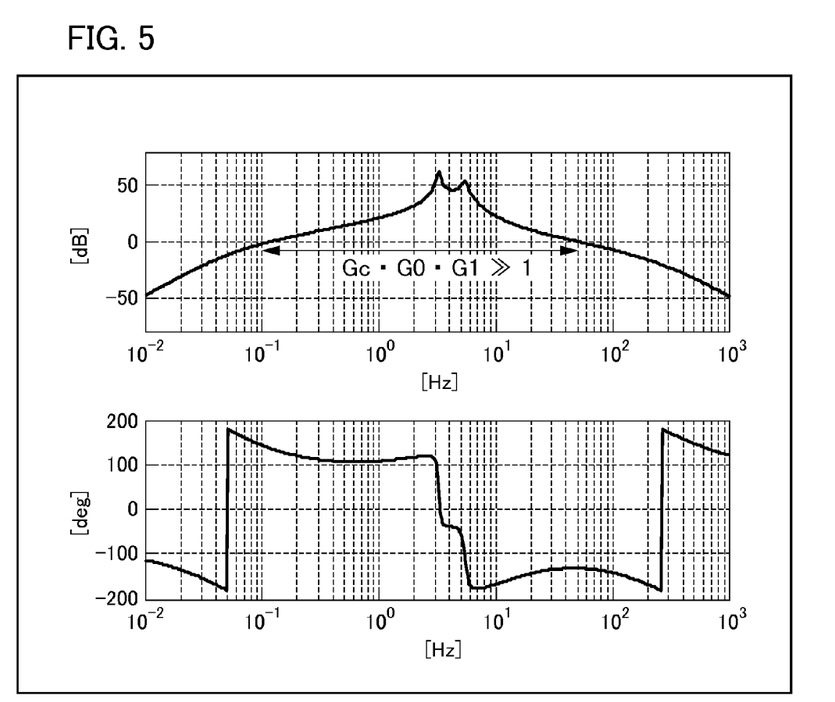
FIG. 5 is a Bode plot of an open loop transfer function of a second feedback control system.

Here, Gc·G0·G1 is an open loop transfer function of the second feedback control system 29. FIG. 5 is a Bode plot illustrating this open loop transfer function. In a bandwidth of Gc·G0·G1>>1 among others, the formula (2) is approximated by the formula (3).

[Formula 3]

$$\text{Second input } 202 = -1 \cdot Fd \qquad (3)$$

In contrast, given that absolute displacement of the base 2 is X0 and a spring constant of the third spring mechanism 33 is K3, then a disturbance force Fd generated on the third object 31 by the absolute displacement X0 of the base 2 is expressed by the formula (4).

[Formula 4]

$$Fd = K3 \cdot X0 \qquad (4)$$

In addition, the second input 202 is expressed by the formula (5) from the formula (3) and the formula (4).

[Formula 5]

$$\text{Second input } 202 = -1 \cdot K3 \cdot X0 \qquad (5)$$

Figure 6:
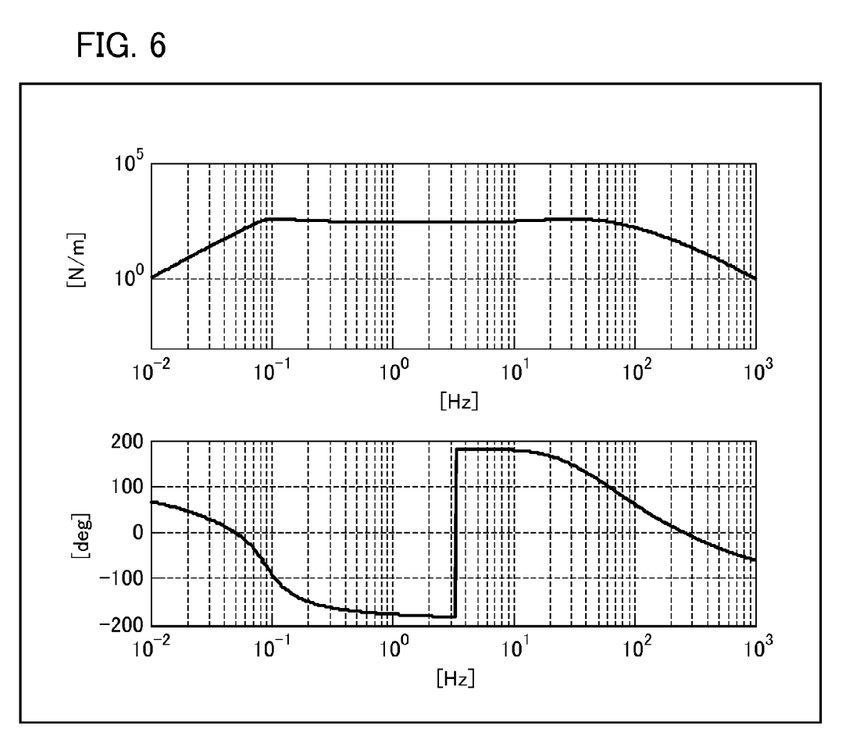
FIG. 6 is a Bode plot of a transfer function from absolute displacement to a second input.

FIG. 6 is a Bode plot illustrating a transfer function from the absolute displacement X0 of the base 2 to the second input 202. It can be seen from FIG. 6 and the formula (5) that the second input 202 is a value proportional to the absolute displacement X0 of the base 2 in a bandwidth of Gc·G0·G>>1 (bandwidth of about 0.1 Hz to about 50 Hz). In addition, the absolute displacement X0 of the base 2 is expressed by the formula (6) by transforming the formula (5).

[Formula 6]

$$X0 = -1 \cdot \frac{\text{Second input } 202}{K3} \qquad (6)$$

Using the formula (6), the absolute displacement X0 of the base 2 can be calculated from the input 202. Thus, the vibration control apparatus 600 uses a feedforward control system 39 to feedforward the second input 202 via a third compensator 35 to the first driving unit 4 so as to compensate a disturbance force generated on the first object 1 by the absolute displacement X0 of the base 2 as shown FIG. 1. Additionally, given that a dynamic characteristic of the first driving unit 4 is expressed as A and a dynamic characteristic of the first spring mechanism 3 as C1·s+K1, then a feedforward input 302 as a third input (third operation signal) is expressed by the formula (7).

[Formula 7]

$$\text{Feedforward input } 302 = \frac{C1 \cdot s + K1}{A} \cdot X0 = \frac{C1 \cdot s + K1}{A} \cdot \frac{-1}{K3} \cdot \text{Second input } 202 \qquad (7)$$

That is, the third compensator 35 is expressed by the formula (8).

[Formula 8]

$$\text{Third compensator } 35 = \frac{C1 \cdot s + K1}{A} \cdot \frac{-1}{K3} \qquad (8)$$

Figure 7:
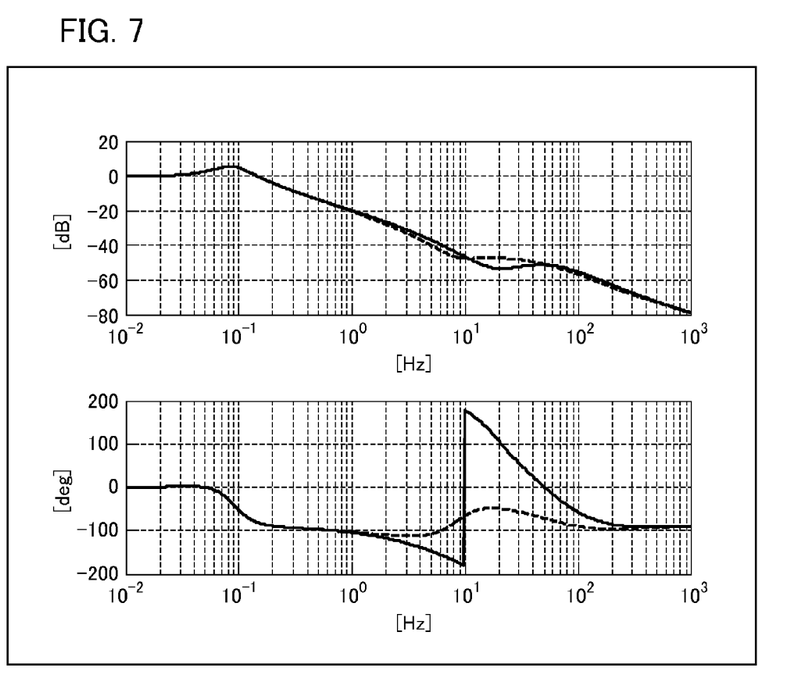
FIG. 7 is a Bode plot of the vibration transmissibility from a base to a first object in a first embodiment.

FIG. 7 is a Bode plot illustrating the vibration transmissibility from the base 2 to the first object 1 when the feedforward control described above is performed in this embodiment. In the figure, the dashed lines indicate the case where the feedforward control system 39 is OFF as a comparative example, and the solid lines indicate the case where the feedforward control system 39 is ON. It can be seen from FIG. 7 that the vibration transmissibility at a frequency of 10 Hz to 50 Hz is reduced by performing such feedforward control.

Thus, the vibration control apparatus 600 uses the second input 202 for feedforward control by utilizing the characteristic of the second input 202, which is a value proportional to the vibration of the base 2 in a certain frequency bandwidth. Accordingly, the vibration control apparatus 600 can improve the vibration isolation performance in a frequency bandwidth exceeding the servo bandwidth of the first feedback control system 9. Further, since a sensor does not need to be newly added to the vibration control apparatus 600 for the feedforward control described above, the cost increase and positional interference that accompanies the addition of the sensor, as well as performance deterioration of the feedforward control can be avoided.

As described above, according to this embodiment, a vibration control apparatus can be provided that is advantageous for expanding a frequency bandwidth of vibration capable of being isolated by a simple configuration.

Second Embodiment

Next, a vibration control apparatus according to a second embodiment of the present invention will be described. In the first embodiment described above, it is shown that the second input 202 is a value proportional to the absolute displacement X0 of the base 2 in a range of Gc·G0·G1≫1. In contrast, the vibration control apparatus according to this embodiment is characterized by not only performing feedforward control that is similar to the first embodiment, but also compensating the phase of a high frequency of the second input 202 using a phase lead compensator so as to reduce the vibration transmissibility at a higher frequency as well. Specifically, a phase lead compensator B1 expressed by the formula (9) is added to the third compensator 35.

[Formula 9]

$$\text{Phase lead compensator } B1 = \frac{s + ww1}{ww1} \quad (9)$$

Here, ww1 is a break frequency of the phase lead compensator B1. Therefore, the third compensator 35 in this embodiment is expressed by the formula (10).

[Formula 10]

$$\text{Third compensator } 35 = -1 \cdot \frac{C1 \cdot s + K1}{A} \cdot \frac{1}{K3} \cdot \frac{s + ww1}{ww1} \quad (10)$$

Figure 8:
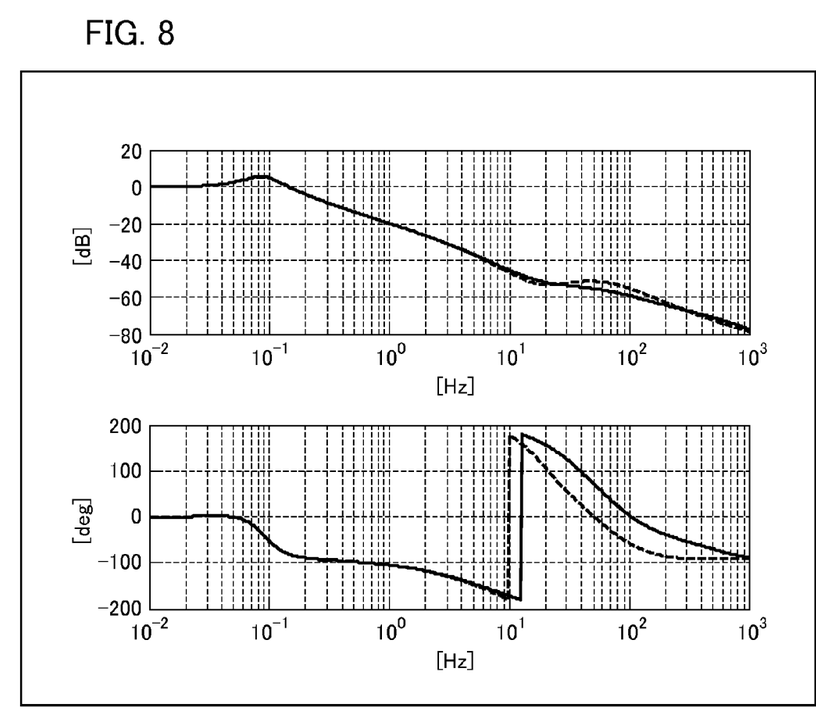
FIG. 8 is a Bode plot of the vibration transmissibility from a base to a first object in a second embodiment.

FIG. 8 is a Bode plot illustrating the vibration transmissibility from the base 2 to the first object 1 in this embodiment. In the figure, the dashed lines indicate the case where the feedforward control system 39 is ON in the first embodiment as a comparative example and the solid lines indicate the case where the feedforward control system 39 is ON in the second embodiment. It can be seen from FIG. 8 that the vibration transmissibility can be reduced even at a high frequency by adding the phase lead compensator B1 to the third compensator 35.

Third Embodiment

Figure 9:
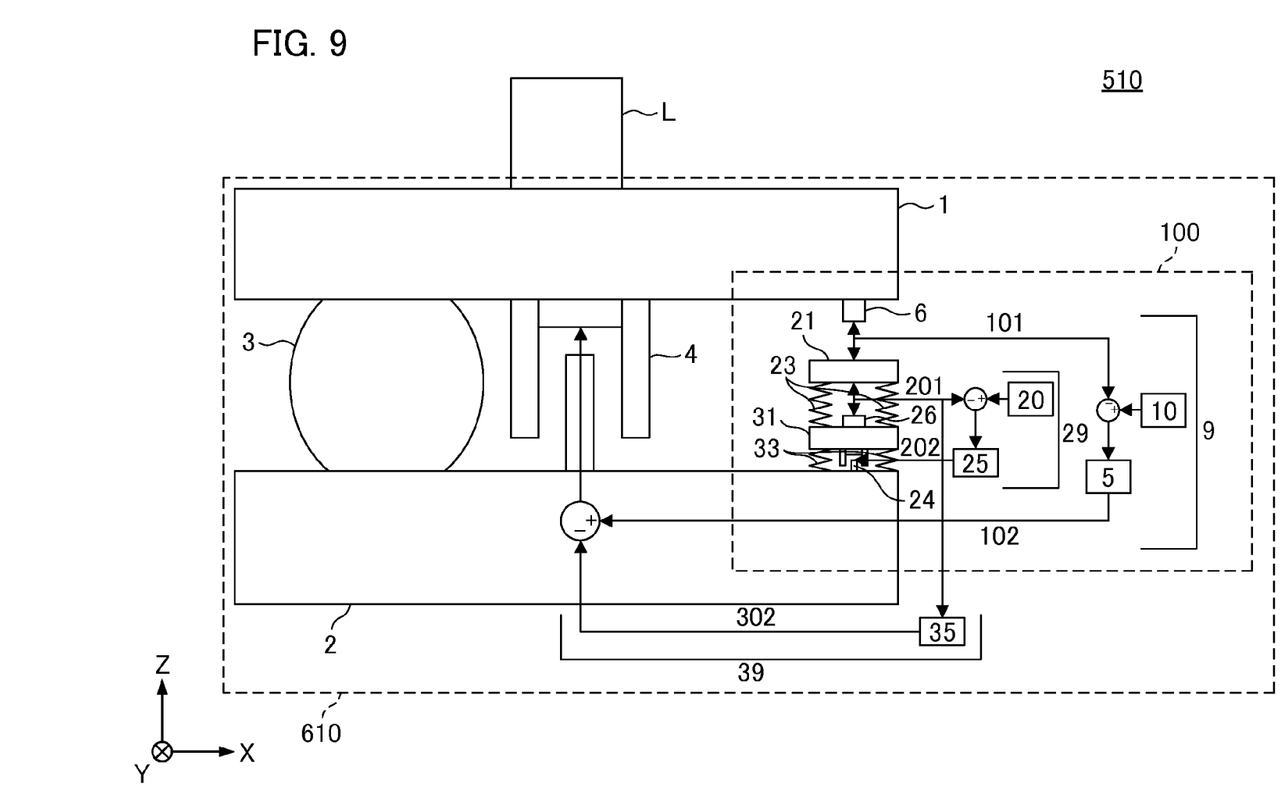
FIG. 9 is a diagram illustrating a configuration of a vibration control apparatus according to a third embodiment of the present invention.

Next, a vibration control apparatus according to a third embodiment of the present invention will be described. In the first embodiment described above, the feedforward input 302 is derived using the second input 202 (second operation signal) to the second driving unit 24. In contrast, this embodiment is characterized by deriving the feedforward input 302 by using the second detection signal 201 of the second detector 26 instead of the second input 202. FIG. 9 is a schematic diagram illustrating a configuration of a lithography apparatus 510 including a vibration control apparatus 610 according to this embodiment. Note that, in the figure, the elements having the same configuration as those of the lithography apparatus 500 according to the first embodiment shown in FIG. 1 are designated by the same reference numerals.

Firstly, it can be seen from FIG. 4, which is a block diagram illustrating the second feedback control system 29, that a transfer function from a disturbance force Fd applied to the third object 31 to the second detection signal 201 is expressed by the formula (11).

[Formula 11]

$$\text{Second detection signal } 201 = \frac{G0 \cdot G1}{1 + Gc \cdot G0 \cdot G1} \cdot Fd \quad (11)$$

In this case, the formula (11) is approximated by the formula (12) in a bandwidth of Gc·G0·G1≫1, among others, which is an open loop transfer function of the second feedback control system 29 in FIG. 5.

[Formula 12]

$$\text{Second detection signal } 201 = \frac{Fd}{Gc} \quad (12)$$

Thus, since the second compensator 25 (Gc) can be approximated as shown in the formula (13) in a bandwidth in which an integrator works, the formula (12) is further expressed by the formula (14).

[Formula 13]

$$\text{Second compensator } 25 = \frac{Ki2}{s} \quad (13)$$

[Formula 14]

$$\text{Second detection signal } 201 = \frac{Fd}{Ki2} \cdot s \quad (14)$$

Therefore, the second detection signal 201 is expressed by the formula (15) based on the formula (14) and the formula (4).

[Formula 15]

$$\text{Second detection signal } 201 = \frac{K3}{Ki2} \cdot X0 \cdot s \quad (15)$$

Figure 10:
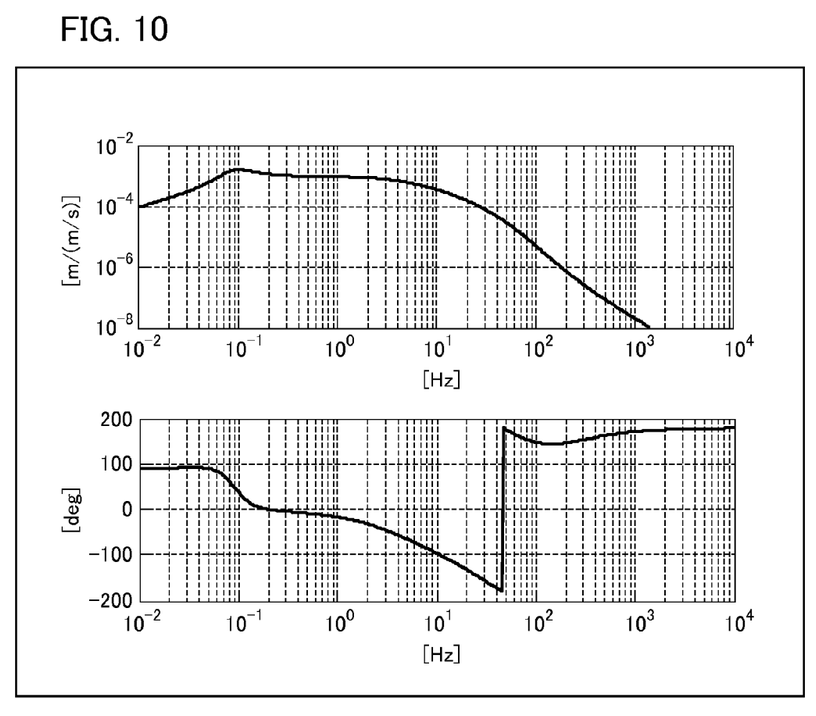
FIG. 10 is a Bode plot of a transfer function from absolute velocity to a second detection signal.

FIG. 10 is a Bode plot illustrating a transfer function from absolute velocity X0·s of the base 2 to the second detection signal 201. It can be seen from FIG. 10 and formula (15) that the second detection signal 201 is a value proportional to the absolute velocity X0·s of the base 2 in a bandwidth of Gc·G0·G1>>1 and a bandwidth on which an integrator of the second compensator 25 works (bandwidth from about 0.1 Hz to about 10 Hz). Then, the absolute velocity X0·s of the base 2 is expressed by the formula (16) by transforming the formula (15).

[Formula 16]

$$X0 \cdot s = \frac{Ki2}{K3} \cdot \text{Second detection signal 201} \quad (16)$$

Using the formula (16), the absolute velocity X0·s of the base 2 can be calculated from the second detection signal 201. Thus, the vibration control apparatus 610 feedforwards the second detection signal 201 via the third compensator 35 to the first driving unit 4 by the feedforward control system 39 so as to compensate a disturbance force generated on the first object 1 by the absolute velocity X0·s of the base 2 as shown FIG. 9. Thus, the feedforward input 302 is expressed by the formula (17).

[Formula 17]

$$\text{Feedforward input 302} = \frac{C1 + K1/s}{A} \cdot X0 \cdot s = \quad (17)$$

$$\frac{C1 + K1/s}{A} \cdot \frac{Ki2}{K3} \cdot \text{Second detection signal 201}$$

That is, the third compensator 35 is expressed by the formula (18).

[Formula 18]

$$\text{Third compensator 35} = \frac{C1 + K1/s}{A} \cdot \frac{Ki2}{K3} \quad (18)$$

Figure 11:
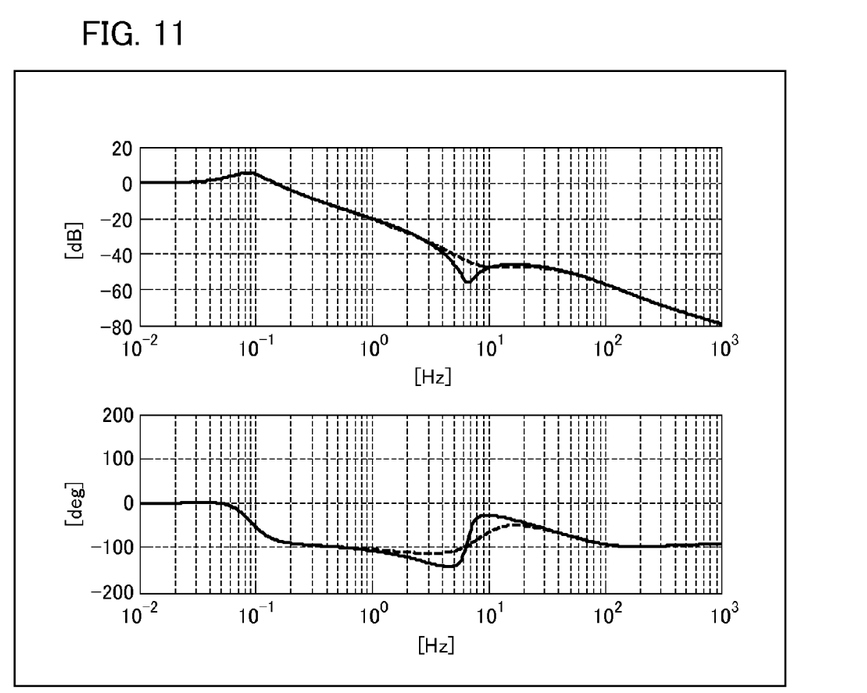
FIG. 11 is a Bode plot of the vibration transmissibility from a base to a first object in a third embodiment.

FIG. 11 is a Bode plot illustrating the vibration transmissibility from the base 2 to the first object 1 in this embodiment when the feedforward control described above is performed. In the figure, the dashed lines indicate the case where the feedforward control system 39 is OFF as a comparative example and the solid lines indicates the case where the feedforward control system 39 is ON. It can be seen from FIG. 11 that the vibration transmissibility at 4 Hz to 10 Hz is reduced by performing the feedforward control described above.

Fourth Embodiment

Next, a vibration control apparatus according to a fourth embodiment of the present invention will be described. In the third embodiment described above, it is shown that the second detection signal 201 is a value proportional to the absolute velocity X0·s of the base 2 in a bandwidth of Gc·G0·G1>>1 and a bandwidth on which an integrator of the second compensator 25 works (bandwidth of about 0.1 Hz to about 10 Hz). In contrast, the vibration control apparatus according to this embodiment is characterize by not only performing feedforward that is similar to the third embodiment, but also compensating the high frequency phase of the second detection signal 201 using the phase lead compensator so as to reduce the vibration transmissibility at a higher frequency as well. Specifically, the phase lead compensator B1 expressed by the formula (19) and the phase lead compensator B2 expressed by the formula (20) are added to the third compensator 35.

[Formula 19]

$$\text{Phase lead compensator } B2 = \frac{s + ww2}{ww2} \quad (19)$$

[Formula 20]

$$\text{Phase lead compensator } B3 = \frac{s^2 + 2 \cdot \zeta 3 \cdot ww3 + ww3^2}{ww3^2} \quad (20)$$

Here, ww2 is a break frequency of the phase lead compensator B2, ww3 is a break frequency of the phase lead compensator B3, and ζ3 is a damping ratio of the phase lead compensator B3. Therefore, the third compensator 35 is expressed by the formula (21) in this embodiment.

[Formula 21]

$$\text{Third compensator 35} = \quad (21)$$

$$\frac{C1 + K1/s}{A} \cdot \frac{Ki2}{K3} \cdot \frac{s + ww2}{ww2} \cdot \frac{s^2 + 2 \cdot \zeta 3 \cdot ww3 + ww3^2}{ww3^2}$$

Figure 12:
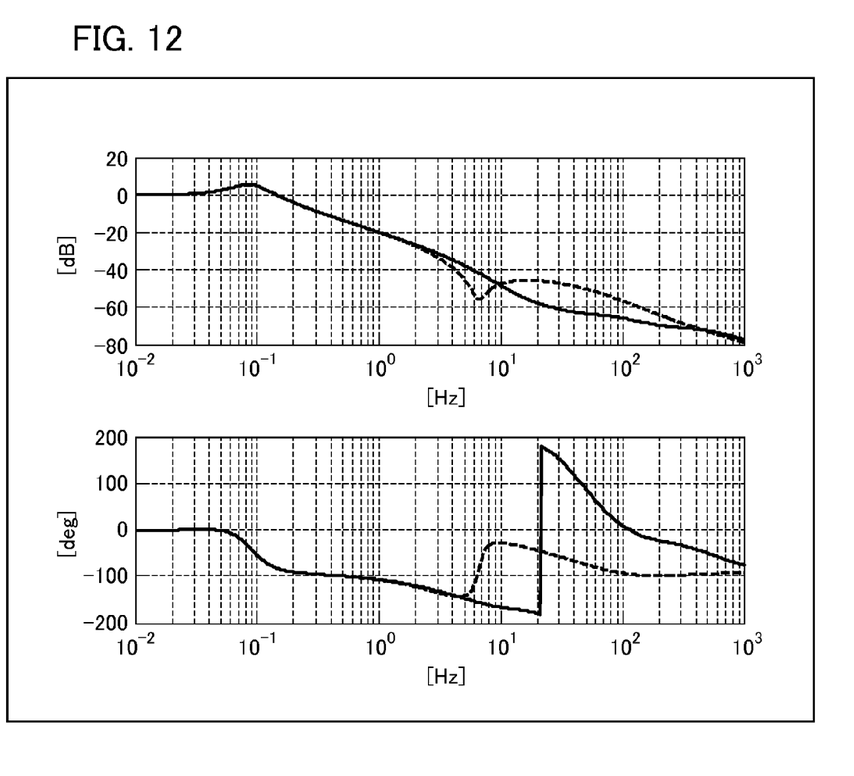
FIG. 12 is a Bode plot of the vibration transmissibility from a base to a first object in a fourth embodiment.

FIG. 12 is a Bode plot illustrating the vibration transmissibility from the base 2 to the first object 1 in this embodiment. In the figure, the dashed lines indicate the case where the feedforward control system 39 is ON in third embodiment as a comparative example and the solid lines indicates the case where the feedforward control system 39 is ON in the fourth embodiment. It can be seen from FIG. 12 that the vibration transmissibility is reduced even at a high frequency by adding the two phase lead compensators B2 and B3 to the third compensator 35.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-127814 filed Jun. 23, 2014, which is hereby incorporated by reference herein in its entirety.

What is claimed is:

1. A vibration control apparatus that controls vibration of a first object, the apparatus comprising:
a first support configured to displaceably support the first object;
a first driving unit configured to displace the first object;
a second object;
a second support configured to displaceably support the second object;
a third object configured to support the second support;
a third support configured to displaceably support the third object;
a second driving unit configured to displace the third object;
a first detector configured to detect a relative position between the first object and the second object;
a second detector configured to detect a relative position between the second object and the third object;
a first control system including a first compensator configured to output a first operation signal for the first driving unit based on a first detection signal output by the first detector;
a second control system including a second compensator configured to output a second operation signal for the second driving unit based on a second detection signal output by the second detector; and
a third control system including a third compensator configured to output a third operation signal for the first driving unit based on a signal relating to the second control system so as to compensate for vibration of a base that supports the apparatus.

2. The apparatus according to claim 1, wherein the third compensator includes a phase lead compensator.

3. The apparatus according to claim 1, wherein the signal relating to the second control system is the second detection signal.

4. The apparatus according to claim 1, wherein the signal relating to the second control system is the second operation signal.

5. The apparatus according to claim 1, wherein the first compensator is configured to output the first operation signal so as to reduce the vibration of the first object.

6. The apparatus according to claim 1, wherein the second compensator is configured to output the second operation signal so as to apply a damping force to the third object.

7. The apparatus according to claim 1, wherein the third compensator is configured to output the third operation signal so as to reduce the vibration of the first object.

8. The apparatus according to claim 1, wherein a detection point of the first detector and a detection point of the second detector are on a straight line extending in a predetermined direction.

9. A lithography apparatus for forming a pattern on a substrate, the apparatus comprising:
a first object for forming the pattern; and
a vibration control apparatus configured to control vibration of the first object,
wherein the vibration control apparatus includes:
a first support configured to displaceably support the first object;
a first driving unit configured to displace the first object;
a second object;
a second support configured to displaceably support the second object;
a third object configured to support the second support;
a third support configured to displaceably support the third object;
a second driving unit configured to displace the third object;
a first detector configured to detect a relative position between the first object and the second object;
a second detector configured to detect a relative position between the second object and the third object;
a first control system including a first compensator configured to output a first operation signal for the first driving unit based on a first detection signal output by the first detector;
a second control system including a second compensator configured to output a second operation signal for the second driving unit based on a second detection signal output by the second detector; and
a third control system including a third compensator configured to output a third operation signal for the first driving unit based on a signal relating to the second control system so as to compensate for vibration of a base that supports the vibration control apparatus.

10. A method of manufacturing an article, the method comprising steps of:
forming a pattern on a substrate using a lithography apparatus, and
processing the substrate, on which the pattern has been formed, to manufacture the article,
wherein the lithography apparatus includes:
a first object for forming the pattern; and
a vibration control apparatus configured to control vibration of the first object, and
wherein the vibration control apparatus includes:
a first support configured to displaceably support the first object;
a first driving unit configured to displace the first object;
a second object;
a second support configured to displaceably support the second object;
a third object configured to support the second support;
a third support configured to displaceably support the third object;
a second driving unit configured to displace the third object;
a first detector configured to detect a relative position between the first object and the second object;
a second detector configured to detect a relative position between the second object and the third object;
a first control system including a first compensator configured to output a first operation signal for the first driving unit based on a first detection signal output by the first detector;
a second control system including a second compensator configured to output a second operation signal for the second driving unit based on a second detection signal output by the second detector; and
a third control system including a third compensator configured to output a third operation signal for the first driving unit based on a signal relating to the second control system so as to compensate for vibration of a base that supports the vibration control apparatus.

* * * * *